(12) United States Patent
Tsuji

(10) Patent No.: US 10,224,697 B2
(45) Date of Patent: Mar. 5, 2019

(54) INTEGRATED QUANTUM CASCADE LASER, SEMICONDUCTOR OPTICAL APPARATUS

(71) Applicant: SUMITOMO ELECTRIC INDUSTRIES, LTD., Osaka (JP)

(72) Inventor: Yukihiro Tsuji, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/659,109

(22) Filed: Jul. 25, 2017

(65) Prior Publication Data

US 2018/0048124 A1 Feb. 15, 2018

(30) Foreign Application Priority Data

Aug. 9, 2016 (JP) .................. 2016-156912

(51) Int. Cl.
*H01S 5/34* (2006.01)
*H01S 5/00* (2006.01)
*H01S 5/026* (2006.01)
*H01S 5/042* (2006.01)
*H01S 5/125* (2006.01)
(Continued)

(52) U.S. Cl.
CPC .......... *H01S 5/3402* (2013.01); *H01S 5/0071* (2013.01); *H01S 5/026* (2013.01); *H01S 5/0425* (2013.01); *H01S 5/125* (2013.01); *H01S 5/227* (2013.01); *H01S 5/3401* (2013.01); *H01S 5/005* (2013.01); *H01S 5/0224* (2013.01); *H01S 5/0265* (2013.01); *H01S 5/12* (2013.01);
(Continued)

(58) Field of Classification Search
CPC .... H01S 5/3402; H01S 5/0425; H01S 5/0071; H01S 5/227; H01S 5/026; H01S 5/125; H01S 5/34313
See application file for complete search history.

(56) References Cited

U.S. PATENT DOCUMENTS 5,294,815 A * 3/1994 Iechi ............... H01L 27/153
257/80
5,825,047 A * 10/1998 Ajisawa ............ G02F 1/025
257/12
(Continued)

FOREIGN PATENT DOCUMENTS

JP 2001-320136 11/2001

*Primary Examiner* — Yuanda Zhang
(74) *Attorney, Agent, or Firm* — Smith, Gambrell & Russell, LLP.

(57) ABSTRACT

An integrated quantum cascade laser includes: a laser structure including first to third regions arranged in a direction of a first axis, the laser structure including a substrate and a laminate including a core layer; first and second metal layers disposed on the third region; third and fourth metal layers disposed on the first region; first to fourth bump electrodes disposed on the first to fourth metal layers, respectively; first and second semiconductor mesas provided in the first region, each of the first and second semiconductor mesas including the core layer; and a distributed Bragg reflector provided in the second region, the distributed Bragg reflector having one or more semiconductor walls. The first and second metal layers are electrically connected to the first and second semiconductor mesas, respectively. The third and fourth metal layers are isolated from the first and second metal layers.

17 Claims, 7 Drawing Sheets

(51) Int. Cl.
  *H01S 5/227* (2006.01)
  *H01S 5/343* (2006.01)
  *H01S 5/022* (2006.01)
  *H01S 5/12* (2006.01)
  *H01S 5/40* (2006.01)

(52) U.S. Cl.
  CPC ......... *H01S 5/2275* (2013.01); *H01S 5/34313* (2013.01); *H01S 5/4031* (2013.01)

(56) References Cited

U.S. PATENT DOCUMENTS

| | | | |
|---|---|---|---|
| 2013/0092850 A1* | 4/2013 | Ootorii | H01L 31/167 250/552 |
| 2013/0156052 A1* | 6/2013 | Diehl | H01S 5/0612 372/20 |
| 2015/0263488 A1* | 9/2015 | Caneau | H01S 5/3402 372/20 |

* cited by examiner

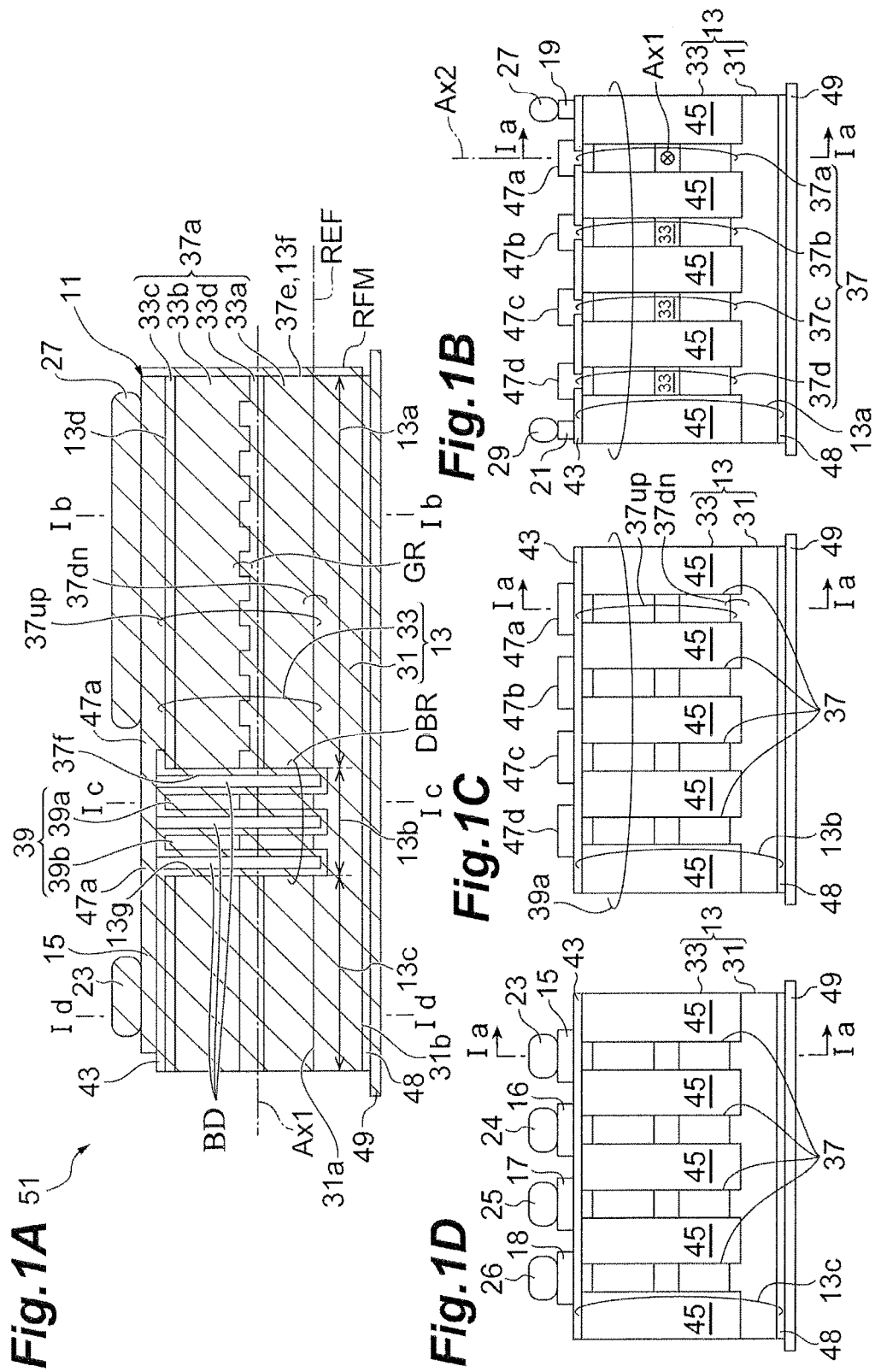

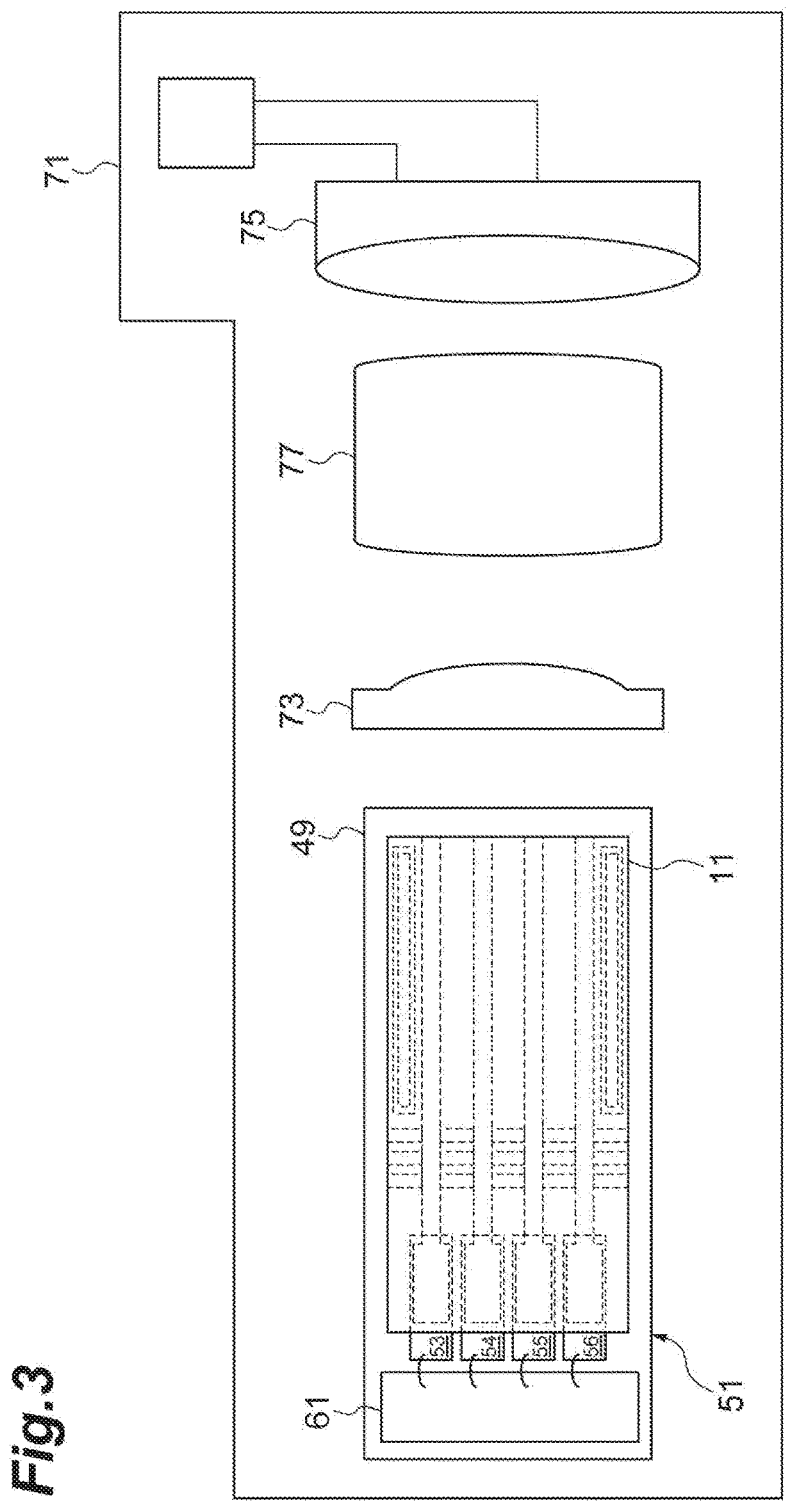

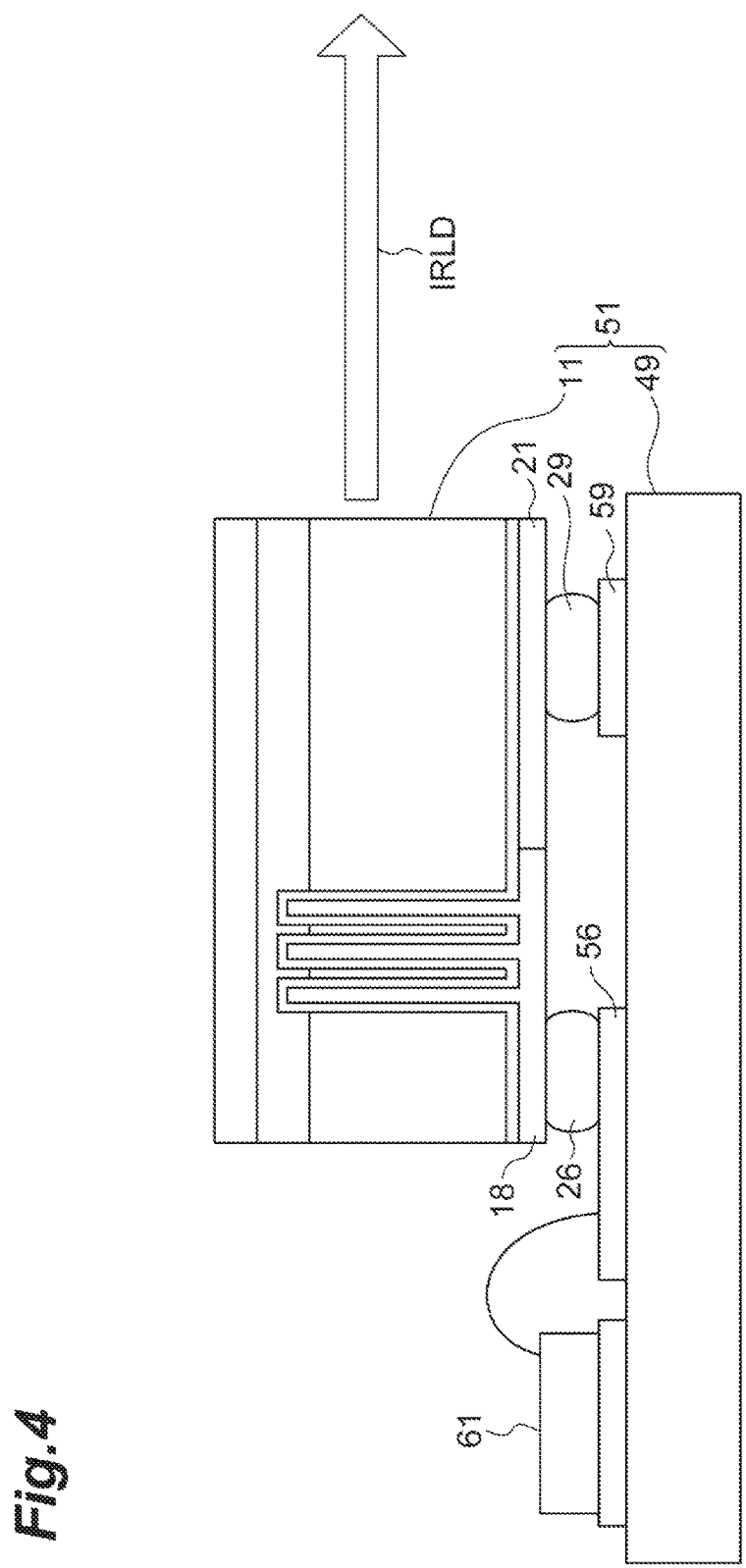

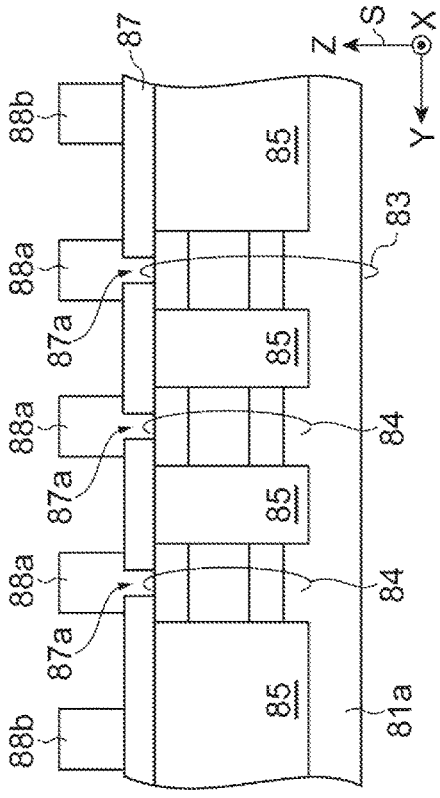
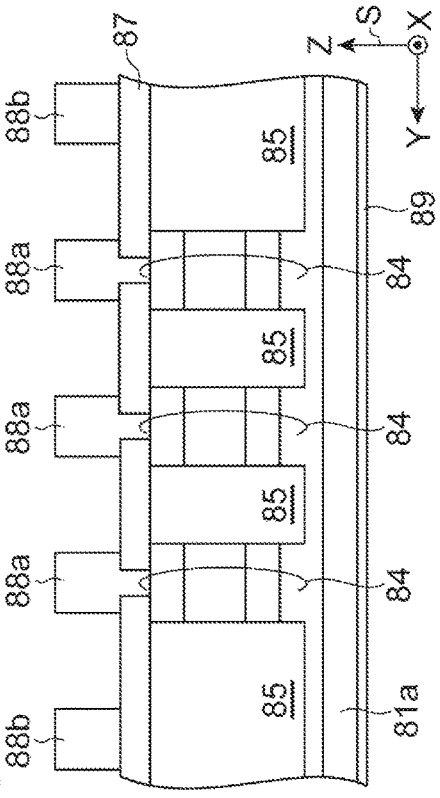
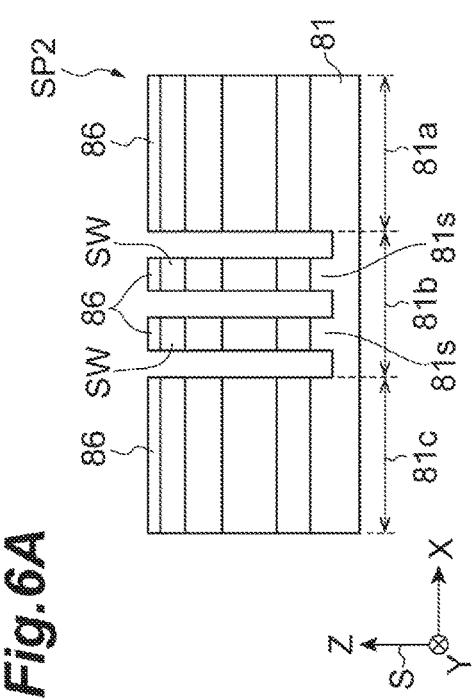
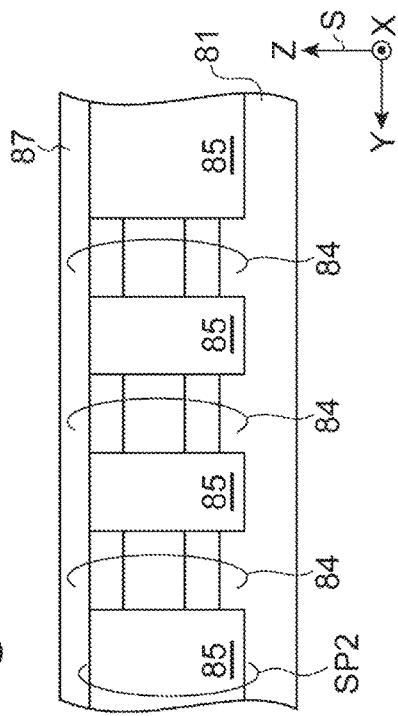

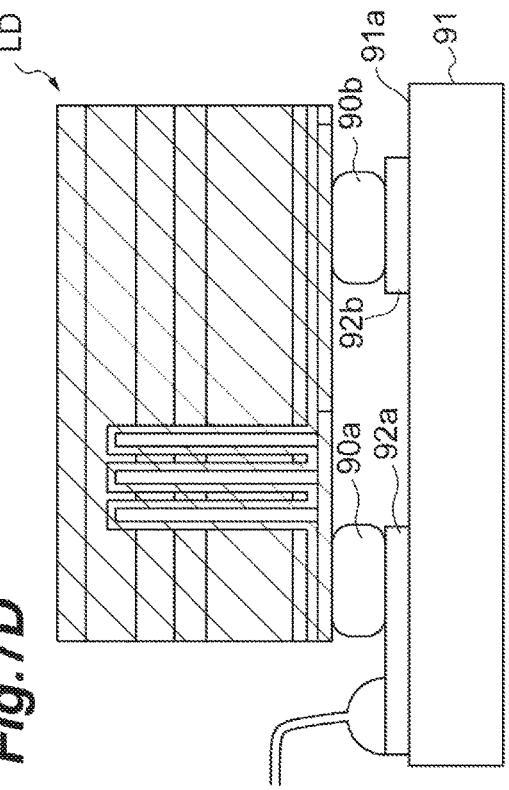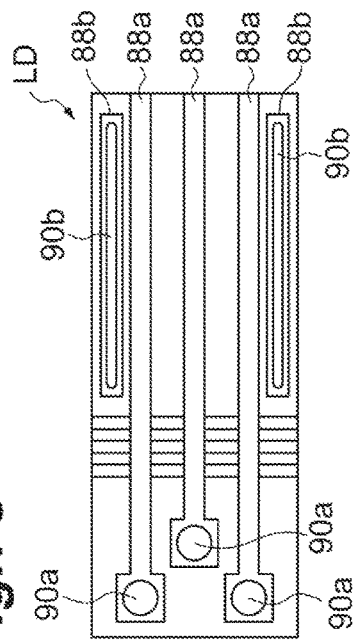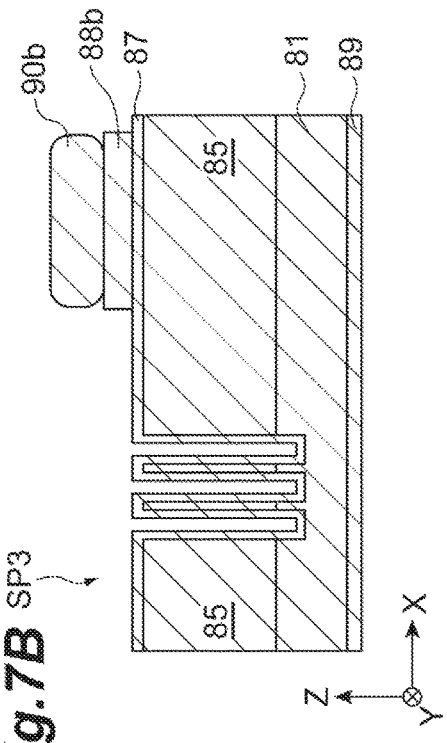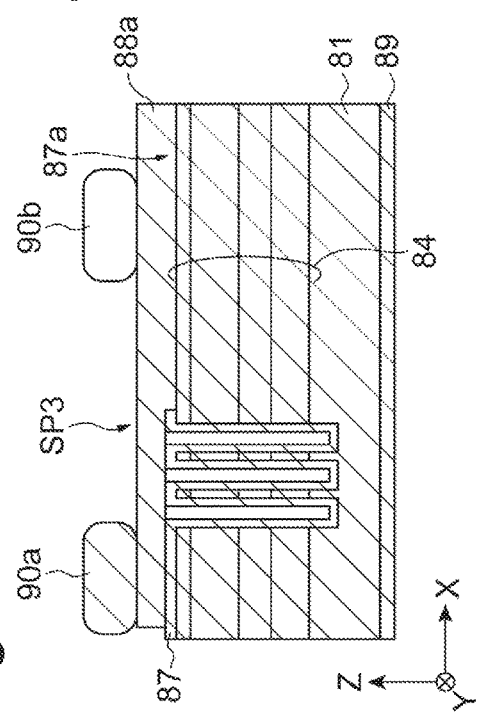

__US 10,224,697 B2__

INTEGRATED QUANTUM CASCADE LASER, SEMICONDUCTOR OPTICAL APPARATUS

BACKGROUND OF THE INVENTION

Field of the Invention

The present invention relates to an integrated quantum cascade laser and a semiconductor optical apparatus. This application claims the benefit of priority from Japanese Patent Application No. 2016-156912 filed on Aug. 9, 2016, which is herein incorporated by reference in its entirety.

Related Background Art

Japanese Unexamined Patent Publication No. 2001-320136 (Japanese Patent Application No. 2001-136193) discloses a quantum cascade laser.

SUMMARY OF THE INVENTION

An integrated quantum cascade laser according to one aspect of the present invention includes: a laser structure including a first region, a second region and a third region which are arranged in a direction of a first axis, the laser structure including a substrate and a laminate which are arranged in a direction of a second axis intersecting the direction of the first axis, the laminate including a core layer having a quantum well structure; a plurality of metal layers including a first metal layer, a second metal layer, a third metal layer, and a fourth metal layer, the first and second metal layers being disposed on the third region, the third and fourth metal layers being disposed on the first region; a plurality of bump electrodes including a first bump electrode disposed on the first metal layer, a second bump electrode disposed on the second metal layer, a third bump electrode disposed on the third metal layer, and a fourth bump electrode disposed on the fourth metal layer; a plurality of semiconductor mesas including a first semiconductor mesa and a second semiconductor mesa that are provided in the first region, each of the first semiconductor mesa and the second semiconductor mesa including the core layer; and a distribute Bragg reflector provided in the second region, the distribute Bragg reflector having one or more semiconductor walls. The first metal layer is electrically connected to the first semiconductor mesa. The second metal layer is electrically connected to the second semiconductor mesa. In addition, the third metal layer and the fourth metal layer are separated apart from the first metal layer and the second metal layer.

A semiconductor optical apparatus according to another aspect of the present invention includes: a mounting member including a first conductive layer, a second conductive layer, a third conductive layer, and a fourth conductive layer; and an integrated quantum cascade laser. The integrated quantum cascade laser including includes: a laser structure including a first region, a second region and a third region which are arranged in a direction of a first axis, the laser structure including a substrate and a laminate which are arranged in a direction of a second axis intersecting the direction of the first axis, the laminate including a core layer having a quantum well structure; a plurality of metal layers including a first metal layer, a second metal layer, a third metal layer, and a fourth metal layer, the first and second metal layers being disposed on the third region, the third and fourth metal layers being disposed on the first region; a plurality of bump electrodes including a first bump electrode disposed on the first metal layer, a second bump electrode disposed on the second metal layer, a third bump electrode disposed on the third metal layer, and a fourth bump electrode disposed on the fourth metal layer; a plurality of semiconductor mesas including a first semiconductor mesa and a second semiconductor mesa that are provided in the first region, each of the first semiconductor mesa and the second semiconductor mesa including the core layer; and a distribute Bragg reflector provided in the second region, the distribute Bragg reflector having one or more semiconductor walls. The first metal layer is electrically connected to the first semiconductor mesa. The second metal layer is electrically connected to the second semiconductor mesa. The third metal layer and the fourth metal layer are separated apart from the first metal layer and the second metal layer. In addition, the first conductive layer, the second conductive layer, the third conductive layer, and the fourth conductive layer support the first bump electrode, the second bump electrode, the third bump electrode and the fourth bump electrode, respectively.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

FIGS. 1A, 1B, 1C and 1D are schematic diagrams each showing an integrated quantum cascade laser according to an embodiment of the present invention.

FIG. 3 is a schematic view showing an optical system including a semiconductor optical apparatus according to the present embodiment.

FIG. 4 is a schematic view showing a semiconductor optical apparatus in the optical system according to the present embodiment.

FIGS. 5A, 5B, 5C, 5D, and 5E are diagrams showing major steps in a method for manufacturing an integrated quantum cascade laser according to the present embodiment and a method for manufacturing a semiconductor optical apparatus according to the present embodiment.

FIGS. 6A, 6B, 6C, and 6D are diagrams showing major steps in a method for manufacturing an integrated quantum cascade laser according to the present embodiment and a method for manufacturing a semiconductor optical apparatus according to the present embodiment.

FIGS. 7A, 7B, 7C, and 7D are diagrams showing major steps in a method for manufacturing an integrated quantum cascade laser according to the present embodiment and a method for manufacturing a semiconductor optical apparatus according to the present embodiment.

DESCRIPTION OF THE EMBODIMENTS

Figure 2A:
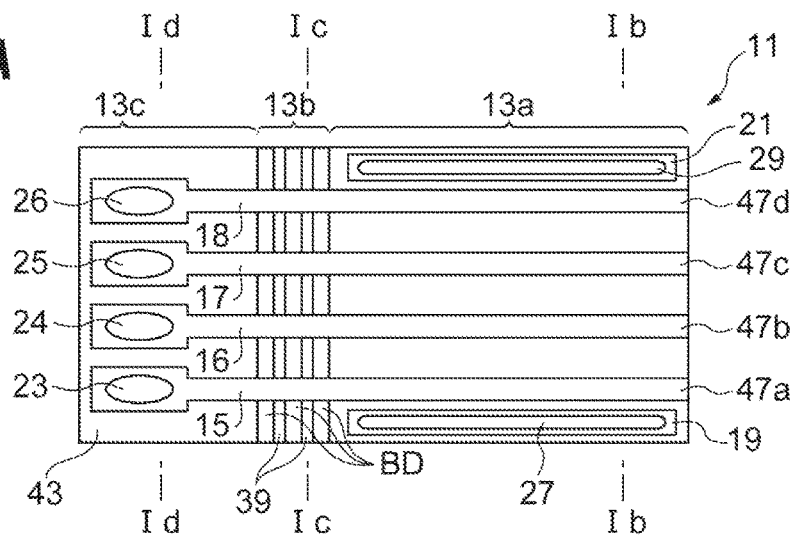
FIGS. 2A, 2B, and 2C are diagrams each showing the integrated quantum cascade laser according to the present embodiment, and a mounting member mounting the integrated quantum cascade laser thereon.

A quantum cascade laser may be used as a small-sized gas-detecting light source having high-speed characteristics and high-sensitivity. To demonstrate an integrated device including such quantum cascade lasers having different lasing wavelengths is useful in some applications. What is needed in demonstrating the integrated quantum cascade laser is to operate it in low power consumption. In order to operate the integrated quantum cascade laser in low power consumption, the integrated quantum cascade laser may include a distributed Bragg reflector as a mirror of a laser cavity. To reduce the power consumption, it is also effective to reduce a length of the laser cavity. In addition, it is also important to improve the heat dissipation characteristics of the integrated quantum cascade laser. Specifically, the dissipation of heat may be improved by using a flip-chip mounting method for the integrated quantum cascade laser, thereby releasing heat from the integrated quantum cascade laser easily.

Integrating a plurality of quantum cascade lasers on a single substrate makes it difficult to mount the integrated quantum cascade laser in a flip-chip manner. Especially, for the quantum cascade laser with a distributed Bragg reflector, it is difficult to mount it by using the flip-chip mounting method to form the integrated quantum cascade laser.

Specific embodiments according to the above aspects are described below.

An integrated quantum cascade laser according to an embodiment of the above aspect includes: (a) a laser structure including a first region, a second region and a third region which are arranged in a direction of a first axis, the laser structure including a substrate and a laminate which are arranged in a direction of a second axis intersecting the direction of the first axis, the laminate including a core layer having a quantum well structure; (b) a plurality of metal layers including a first metal layer, a second metal layer, a third metal layer, and a fourth metal layer, the first and second metal layers being disposed on the third region, the third and fourth metal layers being disposed on the first region; (c) a plurality of bump electrodes including a first bump electrode disposed on the first metal layer, a second bump electrode disposed on the second metal layer, a third bump electrode disposed on the third metal layer, and a fourth bump electrode disposed on the fourth metal layer; (d) a plurality of semiconductor mesas including a first semiconductor mesa and a second semiconductor mesa that are provided in the first region, each of the first semiconductor mesa and the second semiconductor mesa including the core layer; and (e) a distribute Bragg reflector provided in the second region, the distribute Bragg reflector having one or more semiconductor walls. The first metal layer is electrically connected to the first semiconductor mesa. The second metal layer is electrically connected to the second semiconductor mesa. In addition, the third metal layer and the fourth metal layer are separated apart from the first metal layer and the second metal layer.

In the integrated quantum cascade laser, the first metal bump is disposed on the first metal layer connected to the first semiconductor mesa, and the second metal bump is disposed on the second metal layer connected to the second semiconductor mesa. The first and second metal bumps are disposed in the third region, and the third and fourth metal bumps are disposed in the first region. The second region of the laser structure is disposed between the third region, and the first region. In this arrangement of the first, second, third and fourth metal bumps, the first and second metal bumps provided in the third region may be used to connect the integrated quantum cascade laser to the outside, thereby enabling efficient connection. On the other hand, the third and fourth metal bumps in the first region allow the dissipation of heat from the semiconductor mesas in the first region. In addition, the third and fourth metal bumps may protect the semiconductor mesas and the electrodes in the first region from damage that may be caused in a mounting process.

The integrated quantum cascade laser according to an embodiment of the above aspect, the first region may have an end face. The core layer may reach the end face. The end face may extend in a direction intersecting the direction of the first axis.

In the integrated quantum cascade laser, the first region has the end face which can emit laser light therefrom.

The integrated quantum cascade laser according to an embodiment of the above aspect, preferably, each of the semiconductor mesas has an upper portion and a lower portion, and the lower portion of the semiconductor mesa includes a part of the substrate.

In the integrated quantum cascade laser, each semiconductor mesa has a bottom in the substrate so as to confine light of a long wavelength into the semiconductor mesa, effectively.

In the integrated quantum cascade laser according to an embodiment of the above aspect, the semiconductor wall has an upper portion and a lower portion. The lower portion of the semiconductor wall includes a part of the substrate.

In the integrated quantum cascade laser, the semiconductor wall constituting a distributed Bragg reflector has a bottom in the substrate so that the distributed Bragg reflector has a high reflectivity of more than 70% by reflecting light propagating in the substrate.

The integrated quantum cascade laser according to an embodiment of the above aspect may further include: a first interconnect layer connecting the first semiconductor mesa to the first metal layer; and a second interconnect layer connecting the second semiconductor mesa to the second metal layer. Each of the first interconnect layer and the second interconnect layer preferably has an air-bridge structure on the second region.

The integrated quantum cascade laser includes the first interconnect layer and the second interconnect layer each of which has an air bridge structure in the second region. The air bridge structure provides electrical connection without deteriorating the reflection performance of the distributed Bragg reflector in the second region.

In the integrated quantum cascade laser according to an embodiment of the above aspect, preferably, each of the first metal layer and the second metal layer includes a pad electrode configured to connect to an external electronic device.

A semiconductor optical apparatus according to an embodiment of the above aspect includes: a mounting member including a first conductive layer, a second conductive layer, a third conductive layer, and a fourth conductive layer; and the integrated quantum cascade laser described above. The first conductive layer, the second conductive layer, the third conductive layer, and the fourth conductive layer support the first bump electrode, the second bump electrode, the third bump electrode and the fourth bump electrode, respectively.

The semiconductor optical apparatus may prevent the electrodes on the first semiconductor mesa and the second semiconductor mesa of the integrated quantum cascade laser from being in direct contact with the conductive layers of the mounting member.

Teachings of the present invention can be readily understood by considering the following detailed description with reference to the accompanying drawings shown as examples. Referring to the accompanying drawings, embodiments of an integrated quantum cascade laser and a semiconductor optical apparatus according to the present invention will be described. To facilitate understanding, identical reference numerals are used, where possible, to designate identical elements that are common to the figures.

FIGS. 1A, 1B, 1C and 1D are schematic diagrams each showing an integrated quantum cascade laser according to an embodiment according to the present invention.

An integrated quantum cascade laser 11 includes a laser structure 13, a first metal layer 15, a second metal layer 16, a third metal layer 19, a fourth metal layer 21, a fifth metal layer 17, a sixth metal layer 18, a first metal bump 23, a second metal bump 24, a third metal bump 27, a fourth metal bump 29, a fifth metal bump 25 and a sixth metal bump 26. The laser structure 13 includes a first region 13a, a second region 13b, and a third region 13c, which are arranged in the direction of the first axis Ax1. The laser structure 13 includes a substrate 31 and a laminate 33, which are arranged in the direction of the second axis Ax2 intersecting that of the first axis Ax1. The laminate 33 is disposed on the principal surface 31a of the substrate 31. The first region 13a includes a plurality of semiconductor mesas (specifically, a first semiconductor mesa 37a, a second semiconductor mesa 37b, a third semiconductor mesa 37c, and a fourth semiconductor mesa 37d in the present embodiment), each of which extends in the direction of the first axis Ax1. Each semiconductor mesa 37 includes a core layer 33a, a cladding layer 33b, and a contact layer 33c. Each of the core layers 33a includes a quantum well structure in which mid-infrared light is generated. The quantum well structure of the core layer 33a includes well layers made of InGaAs and barrier layers made of InAlAs that are alternately stacked, for example. Each of the core layers may generate mid-infrared light having a wavelength of about 3 to 20 micrometers. In the embodiment, light generated in each of the core layers has a wavelength of about 7 micrometers, for example. Each of the semiconductor mesas 37 may further include a diffraction grating layer 33d. The cladding layer 33b and the diffraction grating layer 33d constitute a diffraction grating GR. In the present embodiment, the diffraction grating GR is included in the first region 13a and is not included in the second region 13b and the third region 13c. The first semiconductor mesa 37a, the second semiconductor mesa 37b, the third semiconductor mesa 37c, and the fourth semiconductor mesa 37d each include a first end face 37e and a second end face 37f, and the third region 13c includes a third end face 37g, and these end faces each may extend along a reference plane intersecting the first axis Ax1. These semiconductor mesas emit respective laser beams through first end face 37e in the first region 13a to the outside. The laser beams enter the second region 13b from the first region 13a through the second end face 37f, and the laser beams thus entered return to the first region 13a through the second end face 37f from the second region 13b. The third region 13c provides a supporting base for the pad electrodes. In the present embodiment, the supporting base includes the third region 13c. The third region 13c, serving as the supporting base, allows the first metal layer 15, the second metal layer 16, the third metal layer 19, and the fourth metal layer 21 to extend from the first region 13a to the third region 13c through the second region 13b.

In the present embodiment, the first end face 37e is located in an end facet 13f of the laser structure 13. The core layer 33a, the diffraction grating layer 33d, the cladding layer 33b, the contact layer 33c, and the diffraction grating GR extends from the first end face 37e to the second end face 37f. The second region 13b includes one or more semiconductor walls 39 (specifically, walls 39a and 39b in the present embodiment). The semiconductor walls 39 are periodically arranged in the direction of the first axis Ax1 to constitute a distributed Bragg reflector DBR. Specifically, the semiconductor walls 39 functions as a high-refractive-index portion of the distributed Bragg reflector DBR. A region between the semiconductor walls 39 along the first axis Ax1 functions as a low-refractive-index portion of the distributed Bragg reflector. In the embodiment, each of the semiconductor walls 39 has a thickness of about 1.75 micrometers that corresponds to 3×λ/(4×n). Herein, "λ" represents a lasing wavelength in vacuum and "n" represents an effective refractive index of the high-refractive-index portion. Similarly, a distance between the semiconductor walls 39 in the direction of the first axis Ax1 is set to be about 5.25 micrometers. The distributed Bragg reflector DBR is optically coupled to the second end face 37f of each of the first semiconductor mesa 37a, the second semiconductor mesa 37b, the third semiconductor mesa 37c, and the fourth semiconductor mesa 37d. The distributed Bragg reflector DBR and the first end face 37e constitute the laser cavity of the integrated quantum cascade laser 11. In the embodiment, the reflecting film RFM may be formed on the first end face 37e to control the reflectivity of the first end face 37e. The distributed Bragg reflector DBR has a high reflectivity of more than 70% in the lasing wavelength region. The reflecting film RFM includes, for example, a dielectric multilayer film. The laser structure 13 includes voids BD, which are defined as gaps. The voids BD are provided between the side faces of the adjacent semiconductor walls 39, between the second end face 37f and the semiconductor wall 39 adjacent thereto, and between the third end face 37g and the semiconductor wall 39 adjacent thereto.

The first region 13a of the laser structure 13 includes a buried region 45 which embeds the first semiconductor mesa 37a, the second semiconductor mesa 37b, the third semiconductor mesa 37c, and the fourth semiconductor mesa 37d. The arrangement of the buried region 45 and the first to fourth semiconductor mesas 37a, 37b, 37c, and 37d may make the surface of the first region 13a substantially flat. In the present embodiment, the second region 13b and the third region 13c each include respective extension portions of the first semiconductor mesa 37a, the second semiconductor mesa 37b, the third semiconductor mesa 37c, and the fourth semiconductor mesa 37d, and these extension portions are also embedded by the buried region 45. The arrangement of the first to fourth semiconductor mesas 37a, 37b, 37c, and 37d and the buried region 45 disposed therebetween may also make the surface of the second region 13b and the third region 13c substantially flat.

The first metal layer 15, the second metal layer 16, the third metal layer 19, the fourth metal layer 21, the fifth metal layer 17, and the sixth metal layer 18 are disposed on the laser structure 13, and the first metal layer 15, the second metal layer 16, the fifth metal layer 17, and the sixth metal layer 18 are electrically connected to the first semiconductor mesa 37a, the second semiconductor mesa 37b, the third semiconductor mesa 37c, and the fourth semiconductor mesa 37d, respectively. Specifically, the integrated quantum cascade laser 11 further includes a first interconnect layer 47a, a second interconnect layer 47b, a third interconnect layer 47c, and a fourth interconnect layer 47d, which connect the first semiconductor mesa 37a, the second semiconductor mesa 37b, the third semiconductor mesa 37c, and the fourth semiconductor mesa 37d to the first metal layer 15, the second metal layer 16, the fifth metal layer 17, and the sixth metal layer 18, respectively. Further, an insulating film 43 is disposed on the upper surface 13d of the laser structure 13. In addition, the insulating film 43 covers the surfaces of the second region 13b and the third region 13c. In the first region 13a, the insulating film 43 has an opening 43a on each of the first semiconductor mesa 37a, the second semiconductor mesa 37b, the third semiconductor mesa 37c, and the fourth semiconductor mesa 37d. In the second region 13b, the insulating film 43 covers the top and side faces of the semiconductor walls 39 and covers the second end face 37f and the third end face 13g. The first, second, fifth, and sixth metal layers 15, 16, 17, and 18 form respective air bridge structures on the second region 13b. The air bridge structures may demonstrate electrical connection without deteriorating the reflecting performance of the distributed reflection structure in the second region 13b.

The first metal layer 15, the second metal layer 16, the fifth metal layer 17, and the sixth metal layer 18 are disposed on the third region 13c to provide pad electrodes. The third metal layer 19 and the fourth metal layer 21 are disposed on the first region 13a. On the first region 13a, the third metal bump 27 and the fourth metal bump 29 are disposed on the third metal layer 19 and the fourth metal layer 21, respectively. On the third region 13c, the first metal bump 23, the second metal bump 24, the fifth metal bump 25 and the sixth metal bump 26 are formed on the first metal layer 15, the second metal layer 16, the fifth metal layer 17 and the sixth metal layer 18, respectively. The third metal layer 19 and the fourth metal layer 21 are separated from the first metal layer 15, the second metal layer 16, the fifth metal layer 17 and the sixth metal layer 18 to enable electrical isolation. In the present embodiment, a common backside electrode 48 is provided on the back surface 31b of the substrate 31.

The integrated quantum cascade laser 11 includes the first metal bump 23, which is formed on the first metal layer 15 connected to the first semiconductor mesa 37a, and the second metal bump 24, which is formed on the second metal layer 16 connected to the second semiconductor mesa 37b. The first metal bump 23 and the second metal bump 24 are provided in the third region 13c, whereas the third metal bump 27 and the fourth metal bump 29 are provided in the first region 13a. The second region 13b of the laser structure 13 is positioned between the first region 13a and the third region 13c. Here, the third metal bump 27 and the fourth metal bump 29 are mounted on the first region 13a. The first metal bump 23 and the second metal bump 24 are mounted on the third region 13c. Arranging the metal bumps in the two regions (specifically, the regions 13a and 13c) separately allows the first metal bump 23 and the second metal bump 24 in the third region 13c to be used to connect the integrated quantum cascade laser 11 to the outside, and allows the third metal bump 27 and the fourth metal bump 29 in the first region 13a to dissipate heat generated in the semiconductor mesas 37 in the first region 13a. Further, the third metal bump 27 and the fourth metal bump 29, which are provided on the first region 13a including the arrangement of the semiconductor mesas 37, can prevent the electrodes (15, 16, 17, and 18) in the first region 13a from damages.

Each of the semiconductor mesas 37 and the semiconductor walls 39 has an upper portion 37up and a lower portion 37dn. The upper portion 37up is defined as a part located above the reference plane REF, which extends along the interface between the substrate 31 and the laminate 33, and the lower part 37dn is defined as a part located below the reference plane REF. The substrate 31 includes ridges formed for lower portions 37dn of the semiconductor mesas 37 and the semiconductor walls 39. The semiconductor mesas 37 that reach the substrate 31 in the height direction makes it possible to confine long-wavelength light beams of quantum cascade lasers in the integrated quantum cascade laser 11 thereinto.

In FIGS. 1A, 1B, 1C and 1D, the integrated quantum cascade laser 11 is mounted on a mounting member 49.
An exemplary integrated quantum cascade laser 11.
Substrate 31: n-type InP substrate.
Core layer 33a: InGaAs/InAlAs.
Cladding layer 33b: n-type InP.
Contact layer 33c: n-type InGaAs.
Diffraction grating layer 33d: InGaAs.
Buried region 45: semi-insulating InP.
Insulating film 43: silicon oxide film.
Metal layer (15, 16, 17, 18, 19, and 21): Ti/Pt/Au laminate.
Bump electrode (23.24, 25, 26, 27, and 29): Indium.

The integrated quantum cascade laser 11 includes the first semiconductor mesa 37a, the second semiconductor mesa 37b, the third semiconductor mesa 37c, and the fourth semiconductor mesa 37d each of which is included in the corresponding quantum cascade semiconductor laser. If needed, these quantum cascade semiconductor lasers may generate laser beams having different lasing wavelengths.

Figure 2B:
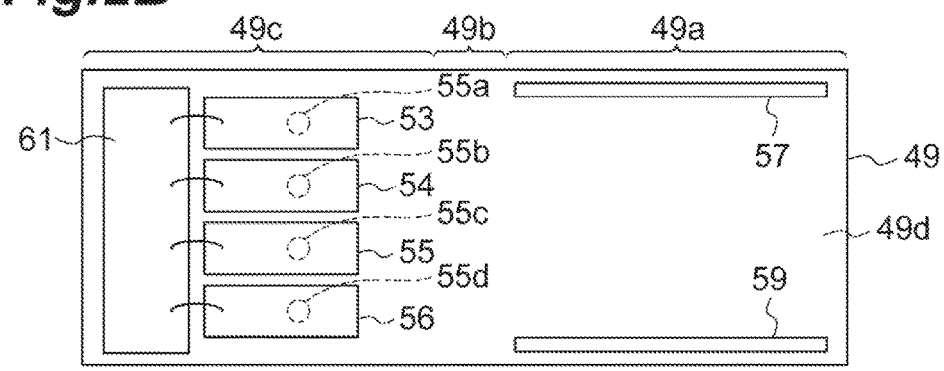
Figure 2C:
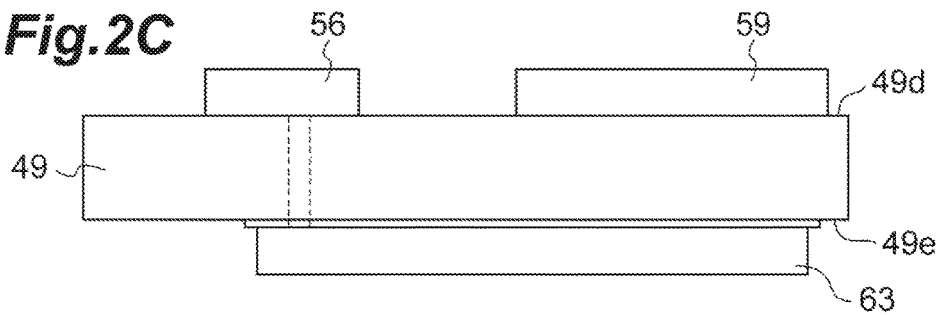

FIG. 2A is a plan view showing an embodiment of the integrated quantum cascade laser 11. FIG. 2B is a plan view showing a mounting member on which the integrated quantum cascade laser as shown in FIG. 1A is mounted through a metal bump, and FIG. 2C is a side view showing the mounting member 49 as shown in FIG. 2B.

A semiconductor optical apparatus 51 includes the integrated quantum cascade laser 11 and a mounting member 49. The mounting member 49 may be, for example, a submount, an interconnection substrate, or a printed circuit board. The mounting member 49 has a principal surface 49d including a first region 49a, a second region 49b, and a third region 49c, which are arranged in one direction. The integrated quantum cascade laser 11 is mounted on the mounting member 49 so that the top surface of the integrated quantum cascade laser 11 faces the principal surface 49d of the mounting member. The mounting member 49 includes a first conductive layer 53, a second conductive layer 54, a third conductive layer 57, a fourth conductive layer 59, a fifth conductive layer 55, and a sixth conductive layer 56. The first conductive layer 53, the second conductive layer 54, the third conductive layer 57, the fourth conductive layer 59, the fifth conductive layer 55, and the sixth conductive layer 56 are disposed on the principal surface 49d of the mounting member 49. The third conductive layer 57 and the fourth conductive layer 59 are disposed in the first region 49a. The first conductive layer 53, the second conductive layer 54, the fifth conductive layer 55, and the sixth conductive layer 56 are disposed in the third region 49c. The first conductive layer 53, the second conductive layer 54, the third conductive layer 57, the fourth conductive layer 59, the fifth conductive layer 55, and the sixth conductive layer 56 support the first metal bump 23, the second metal bump 24, the third metal bump 27, the fourth metal bump 29, the fifth metal bump 25, and the sixth metal bump 26 of the integrated quantum cascade laser 11, respectively, and can be electrically connected to the integrated quantum cascade laser 11.

In the semiconductor optical apparatus 51, the conductive layer of the mounting member 49 is not in contact with the interconnect layers (47a, 47b, 47c, and 47d) of the integrated quantum cascade laser 11. The mounting member 49 supports the integrated quantum cascade laser 11 at the third metal bump 27 and the fourth metal bump 29 located on the third metal layer 19 and the fourth metal layer 21, respectively, which are spaced apart from the interconnect layers (47a, 47b, 47c, and 47d). The semiconductor optical apparatus 51 may include an electronic device 5 (for example, a laser driver) disposed on the top face 49d of the third region 49c. Further, the semiconductor optical apparatus 51 may include another electronic device 63 (for example, a laser driver) disposed on the rear face 49e of the mounting member 49, which is connected to the first conductive layer 53, the second conductive layer 54, the fifth conductive layer 55, and the sixth conductive layer 56 through respective vias (55a, 55b, 55c, and 55d) of the mounting member 49. The electronic device 63 is not connected to the third conductive layer 57 and the fourth conductive layer 59.

The pad electrodes and bump electrodes of the integrated quantum cascade laser 11 are arranged along a single side of the integrated quantum cascade laser 11. Such an arrangement of the pad electrodes and the bump electrodes facilitates connecting the integrated quantum cascade laser 11 to external electronic devices, and the electrical connection does not interfere the optical coupling between the integrated quantum cascade laser 11 and external optical devices. Both the bump electrodes used to electrically connect the integrated quantum cascade laser 11, and the bump electrodes used to support the integrated quantum cascade laser 11, are disposed outside the second region 13b including the distributed Bragg reflector DBR. This location of the distributed Bragg reflector DBR in the integrated quantum cascade laser 11 may prevent the distributed Bragg reflector DBR from directly receiving force in mounting the integrated quantum cascade laser 11.

FIG. 3 is a schematic view showing an optical device 71 including the semiconductor optical device shown in FIG. 1A. FIG. 4 is a schematic view showing the semiconductor optical device 51 in the optical device 71. The optical device 71 includes the semiconductor optical device 51, a plano-convex lens 73, a photodetector 75, and a container 77. The container 77 accommodates an article to be observed. The container 77 (e.g., a gas cell) is disposed between the plano-convex lens 73 and the photodetector 75. The article in the container 77 is irradiated through the plane convex lens 73 with infrared light IRLD emitted from the semiconductor light apparatus 51. The photodetector 75 receives light through the container 77 in which the article is included.

Exemplary semiconductor optical apparatus 51.
Size of the integrated quantum cascade laser 11: 1 mm×2 mm.
Height of semiconductor walls 39 of the distributed Bragg reflector in the integrated quantum cascade laser 11: 10 micrometers or more.
Thickness of bump electrodes: 10 micrometers or more.
Thickness of the metal layer: 3 micrometers or more on the second region 13b.
Lower limit of spacing between the semiconductor mesas (47): 50 to 100 micrometers.
Density of arrayed semiconductor mesas (47): 10 to 20 channels per millimeter.
The first metal layer 15, the second metal layer 16, the fifth metal layer 17 and the sixth metal layer 18, which work as the electrode pads, are formed together with the third metal layer 19 and the fourth metal layer 21, which work as the supporting pads, and all of the metal layers have the same structure in the embodiment. These metal layers mount bump electrodes, which are fabricated in a single step and have the same structure. The bump electrodes for supporting are disposed on the first region 13a, whereas the bump electrodes for electrical connection are disposed on the third region 13c. The integrated quantum cascade laser 11 is supported by use of both the supporting bump electrodes on the first region 13a and the electrically-connecting bump electrodes on the third region 13c, which is away from the first region 13a. The interconnect layers of the integrated quantum cascade laser 11 is supported through the bump electrodes by the electrodes of the mounting member, which are not in direct contact therewith, and in particular, the interconnect layers on the second region 13b are not in contact with the mounting member.

Figures 5A, 5B, 5C, 5D, 5E:
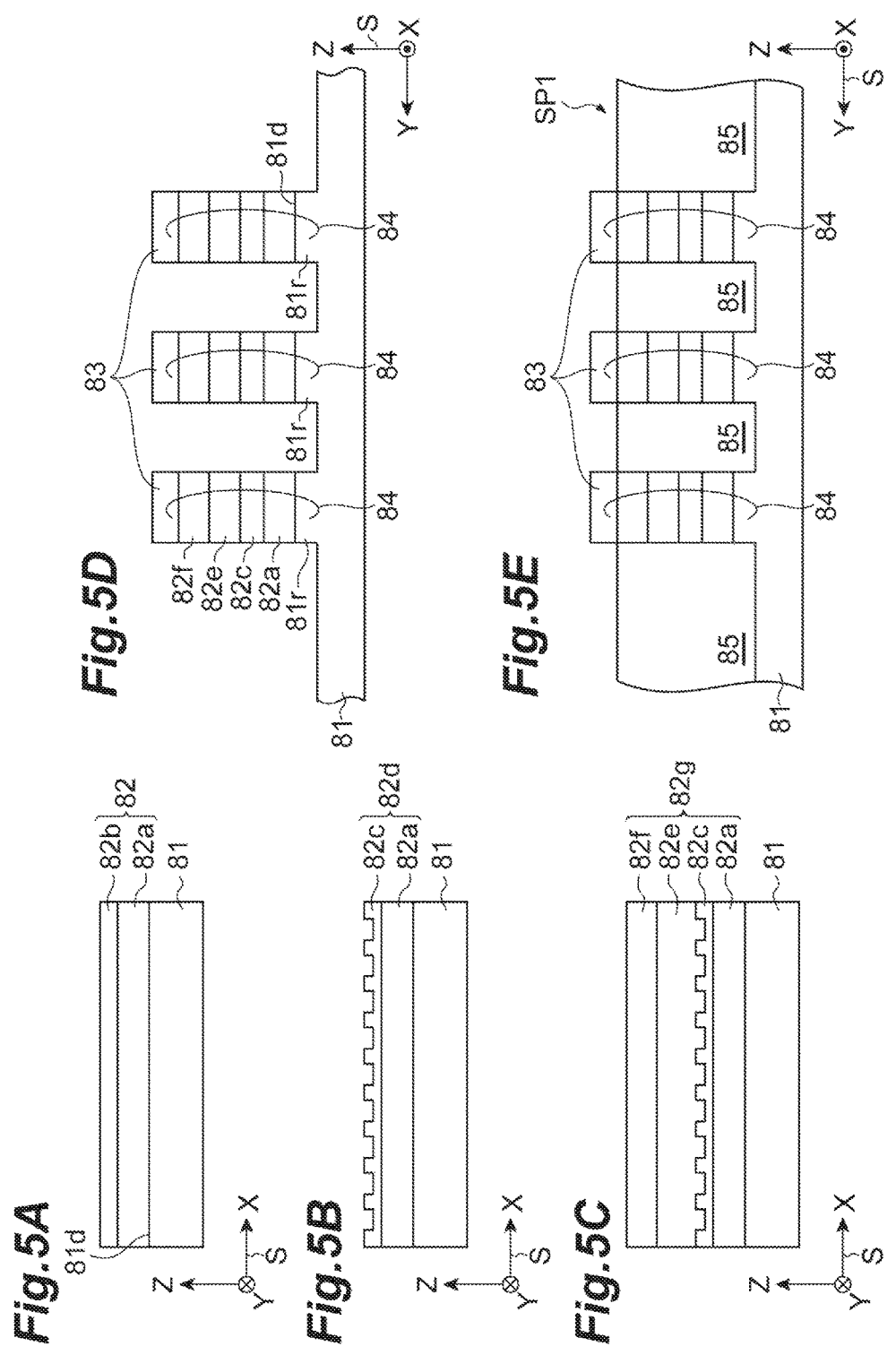

With reference to FIGS. 5A, 5B, 5C, 5D and 5E, FIGS. 6A, 6B, 6C, and 6D, and FIGS. 7A, 7B, 7C and 7D, major steps in a method of fabricating an integrated quantum cascade laser 11 and a method of fabricating a semiconductor optical apparatus will be described below. An explanation on the above fabrications will be made in detail, and begins with the fabrication of a first substrate product which includes an array of device sections, each of which has the laser structure 13. The drawings each show a single device section, and are referred to in the following description. Each drawing contains an orthogonal coordinate system which is used indicate the orientation of a product in the step shown therein. As shown in FIG. 5A, a semiconductor substrate 81, such as an InP wafer, is prepared. The principal surface 81d of the semiconductor substrate 81 extends parallel to a plane defined by the X- and Y-axes of the orthogonal coordinate system S. Semiconductor layers are grown to be stacked in the Z-axis direction. The first semiconductor laminate 82 is grown on the semiconductor substrate 81. This growth is performed by a growth method, such as a molecular beam epitaxy method and a metalorganic vapor phase epitaxy method. The first semiconductor laminate 82 includes a semiconductor layer 82a (e.g., InGaAs/InAlAs quantum well structure, 2.3 micrometer thick) and a semiconductor layer 82b (InGaAs, 0.5 micrometer thick). The semiconductor layer 82a is formed to become a quantum cascade core layer. The semiconductor layer 82b is formed to become a diffraction grating layer. As shown in FIG. 5B, a diffraction grating BR is formed in the semiconductor layer 82b by photolithography and etching so as to form a semiconductor layer 82c having the diffraction grating BR. The second semiconductor laminate 82d includes the semiconductor layer 82a and the semiconductor layer 82c formed on the semiconductor layer 82a. As shown in FIG. 5C, a semiconductor layer 82e (e.g., n-type InP, 3 micrometer thick) to become a cladding layer and a semiconductor layer 82f (e.g., n-type InGaAs, 100 nanometer thick) to become a contact layer are grown on the second semiconductor laminate 82d to form a third semiconductor laminate 82g. As shown in FIG. 5D, a mask 83 for forming laser waveguides is formed on the third semiconductor laminate 82g. The mask 83 may be made of a silicon-based inorganic insulating film (for example, SiN), and has, for example, stripe-shaped patterns for forming mesas in each device section. The width of the stripe-shaped patterns is set to be, for example, 3 to 10 micrometers, and corresponds to the width of the mesas to be formed. The third semiconductor laminate 82g is etched with the mask 83 to form an array of semiconductor mesas 84. This etching may be performed by using a dry etching with an etchant, such as chlorine, silicon tetrachloride, boron trichloride or hydrogen iodide. The height of the semiconductor mesas 84 is set to be, for example, 7 micrometers or more. Each of the semiconductor mesas 84 includes a ridge portion 81r of the semiconductor substrate 81. As shown in FIG. 5E, a buried layer is grown on side surfaces of the semiconductor mesas 84 and on the substrate by using the mask 83 being left, thereby forming the first semiconductor product SP1. As a result of growing the buried layer, a buried region 45 (for example, semi-insulating InP) embedding the semiconductor mesas 84 is formed. The buried region 45 has such a thickness as to embed the semiconductor mesas 84 to form a substantially-planar laser structure. After forming the buried region 45, the mask 83 is removed.

As shown in FIG. 6A, the semiconductor substrate 81 has a first region 81*a*, a second region 81*b*, and a third region 81*c* in one device section, which are arranged in the direction of the X-axis (the direction of the first axis Ax1 shown in FIGS. 1A, 1B, 1C and 1D). In order to fabricate the distributed Bragg reflector DBR, a mask 86 is formed on the first semiconductor product SP1. The semiconductor structure on the first region 81*a* and the third region 81*c* is covered with the mask 86. The mask 86 has a pattern that defines the distributed Bragg reflector DBR on the second region 81*b*. The first semiconductor product SP1 is etched with the mask 86 to form the second semiconductor product SP2 including the structure for forming the distributed Bragg reflector DBR. This etching may be performed by using a dry etching with a gaseous etchant, such as chlorine, silicon tetrachloride, boron trichloride or hydrogen iodide. The structure for forming the distributed Bragg reflector DBR includes one or more semiconductor walls SW each having a height of 7 micrometers or more, and the height is, for example, 10 micrometers in the present embodiment. Each semiconductor wall SW includes the ridge portion 81*s* of the semiconductor substrate 81. Preferably, the mask pattern of the mask 86 for forming the distributed Bragg reflector DBR is designed such that the cavity length is less than 500 micrometers.

As shown in FIG. 6B, a protective insulating film 87 is formed on the surface of the second semiconductor product SP2. The insulating film 87 includes, for example, a silicon oxynitride (SiON) film. As shown in FIG. 6C, the insulating film 87 is processed by photolithography and etching to form openings 87*a* therein, which are positioned in association with the location of the semiconductor mesas 84 in the first region 81*a*. An electrode layer 88*a* is formed on the buried region 85 in the second and third regions 81*b* and 81*c*, and on the semiconductor mesas 84 in the first region 81*a*. The electrode layer 88*a* is also formed in the openings 87*a* in the first region 81*a* to contact the top surface of the semiconductor mesas 84. The supporting metal layer 88*b* is formed on the first region 81*a*. These layers are simultaneously formed by using a single deposition process and a lift-off method. In order to provide the electrode layer 88*a* with an air bridge structure getting across voids between the semiconductor walls for constituting the distributed Bragg reflector DBR, the metal deposition follows the application of resist to fill the voids between the semiconductor walls with. The electrode layer 88*a* makes contact with the top surface of each semiconductor mesa 84 via the opening 87*a* of the insulating film 87, whereas the supporting metal layer 88*b* is spaced apart from the electrode layer 88*a*. As shown in FIG. 6D, if necessary, the backside of the semiconductor substrate 81 is polished to form a polished back face, and an electrode 89 is formed on the back face. As shown in FIGS. 7A and 7B, bump electrodes 90*a* and bump electrodes 90*b* are formed on the electrode layer 88*a* in the third region 81*c* and on the supporting metal layer 88*b* in the first region 81*a*, respectively, to form a substrate product SP3. The bump electrodes 90*a* and 90*b* are made of, for example, indium bumps, which may be formed in a single process. The bump electrodes 90*a* and 90*b* are not formed on the second region 81*b*. As shown in FIG. 7C, the substrate product SP3 is separated to form each semiconductor chip of a semiconductor laser integrated device LD.

As shown in FIG. 7D, the semiconductor laser integrated device LD thus formed is mounted on the mounting member 91. The mounting member 91 includes a conductive layer 92*a* and a conductive layer 92*b*, which are disposed on the principal surface 91*d* of the base. The bump electrodes 90*a* of the semiconductor laser integrated device LD are connected to the conductive layer 92*a* and the bump electrodes 90*b* of the semiconductor laser integrated device LD are connected to the conductive layer 92*b*.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:

1. An integrated quantum cascade laser comprising:
   a laser structure including a first region, a second region and a third region which are arranged along a first axis, the laser structure including a substrate and a laminate which are arranged along a second axis intersecting the first axis, the laminate including a core layer having a quantum well structure;
   a plurality of metal layers including a first metal layer, a second metal layer, a third metal layer, and a fourth metal layer, the first and second metal layers being disposed on the third region, the third and fourth metal layers being disposed on the first region;
   a plurality of bump electrodes including a first bump electrode disposed on the first metal layer, a second bump electrode disposed on the second metal layer, a third bump electrode disposed on the third metal layer, and a fourth bump electrode disposed on the fourth metal layer;
   a plurality of semiconductor mesas including a first semiconductor mesa and a second semiconductor mesa that are provided in the first region, each of the first semiconductor mesa and the second semiconductor mesa including the core layer and extending alone the first axis;
   an insulating film disposed between the laminate and the third metal layer and between the laminate and the fourth metal layer; and
   a distributed Bragg reflector provided in the second region, the distributed Bragg reflector having a plurality of semiconductor walls, wherein
   the first metal layer is electrically connected to the first semiconductor mesa,
   the second metal layer is electrically connected to the second semiconductor mesa,
   the third metal layer and the fourth metal layer are separated apart from the first metal layer and the second metal layer,
   the third and the fourth metal layers are electrically isolated from the first and the second semiconductor mesas by the insulating film,
   the third and the fourth metal layers extend along the first axis, and
   the first and the second semiconductor mesas are disposed between the third metal layer and the fourth metal laver.

2. The integrated quantum cascade laser according to claim 1,
   wherein the first region has an end face,
   the core layer reaches the end face, and
   the end face extends in a direction intersecting the first axis.

3. The integrated quantum cascade laser according to claim 1, wherein
   each of the semiconductor mesas has an upper portion and a lower portion, and
   the lower portion of each semiconductor mesa includes a part of the substrate.

4. The integrated quantum cascade laser according to claim 1, wherein
   each semiconductor wall has an upper portion and a lower portion,
   the lower portion of each semiconductor wall includes a part of the substrate,
   each of the semiconductor walls is covered with the insulating film, and
   adjacent semiconductor walls are separated by a gap.

5. The integrated quantum cascade laser according to claim 1, further comprising:
   a first interconnect layer connecting the first semiconductor mesa to the first metal layer; and
   a second interconnect layer connecting the second semiconductor mesa to the second metal layer,
   wherein each of the first interconnect layer and the second interconnect layer has an air-bridge structure on the second region.

6. The integrated quantum cascade laser according to claim 1,
   wherein each of the first metal layer and the second metal layer includes a pad electrode configured to connect to an external electronic device.

7. A semiconductor optical apparatus comprising:
   a mounting member including a first conductive layer, a second conductive layer, a third conductive layer, and a fourth conductive layer; and
   an integrated quantum cascade laser, wherein the integrated quantum cascade laser includes:
   a laser structure including a first region, a second region and a third region which are arranged along a first axis, the laser structure including a substrate and a laminate which are arranged along a second axis intersecting the first axis, the laminate including a core layer having a quantum well structure;
   a plurality of metal layers including a first metal layer, a second metal layer, a third metal layer, and a fourth metal layer, the first and second metal layers being disposed on the third region, the third and fourth metal layers being disposed on the first region;
   a plurality of bump electrodes including a first bump electrode disposed on the first metal layer, a second bump electrode disposed on the second metal layer, third bump electrode disposed on the third metal layer, and a fourth bump electrode disposed on the fourth metal layer;
   a plurality of semiconductor mesas including a first semiconductor mesa and a second semiconductor mesa that are provided in the first region, each of the first semiconductor mesa and the second semiconductor mesa including the core layer and extending along the first axis; and
   an insulating film disposed between the laminate and the third metal layer and between the laminate and the fourth metal layer;
   a distributed Bragg reflector provided in the second region, the distributed Bragg reflector having a plurality of semiconductor walls, wherein
   the first metal layer is electrically connected to the first semiconductor mesa,
   the second metal layer is electrically connected to the second semiconductor mesa,
   the third metal layer and the fourth metal layer are separated apart from the first metal layer and the second metal layer,
   the third and the fourth metal layers are electrically isolated from the first and the second semiconductor mesas by the insulating film,
   the third and the fourth metal layers extend along the first axis, and
   the first and the second semiconductor mesas are disposed between the third metal layer and the fourth metal layer, and wherein
   the first conductive layer, the second conductive layer, the third conductive layer, and the fourth conductive layer support the first bump electrode, the second bump electrode, the third bump electrode and the fourth bump electrode, respectively.

8. An integrated quantum cascade laser comprising:
   a laser structure including a first region, a second region and a third region which are arranged along a first axis;
   a first metal layer disposed for a pad electrode on the third region;
   a second metal layer disposed for a pad electrode on the third region;
   a third metal layer disposed on the first region;
   a fourth metal layer disposed on the first region;
   a first bump electrode disposed on the first metal layer;
   a second bump electrode disposed on the second metal layer;
   a third bump electrode disposed on the third metal layer;
   a fourth bump electrode disposed on the fourth metal layer; and
   an insulating film separating the laser structure from the third metal layer, from the fourth metal layer, from the third bump electrode, and from the fourth bump electrode to electrically isolate the third metal layer, the fourth metal layer, the third bump electrode and the fourth bump electrode from the laser structure,
   the first region and the third region including a substrate and a laminate which are arranged along a second axis intersecting the first axis,
   the first region including a first semiconductor mesa and a second semiconductor mesa,
   each of the first semiconductor mesa and the second semiconductor mesa having a core region,
   the second region having semiconductor walls for a distributed Bragg reflector,
   the first metal layer being electrically connected to the first semiconductor mesa,
   the second metal layer being electrically connected to the second semiconductor mesa, and
   the third metal layer and fourth metal layer being separated apart from the first metal layer and the second metal layer.

9. The integrated quantum cascade laser according to claim 8, wherein
   the first region has an end face,
   the core region extends from the end face,
   the end face extends in a direction intersecting the first axis, and
   the end face is optically coupled to the second region.

10. The integrated quantum cascade laser according to claim 8, wherein each of the semiconductor walls includes the laminate.

11. The integrated quantum cascade laser according to claim 8, wherein each of the semiconductor walls has a top face and a side face that are in contact with the insulating film.

12. The integrated quantum cascade laser according to claim 9, wherein each of the first and the second semiconductor mesas further includes a diffraction grating layer extending from the end face.

13. The integrated quantum cascade laser according to claim 8, further including:
- a first interconnected layer in contact with the first semiconductor mesa, and
- a second interconnect layer in contact with the second semiconductor mesa, wherein
  - the first interconnect layer and the second interconnect layer extend over the semiconductor walls to the first metal layer and to the second metal layer, respectively.

14. The integrated quantum cascade laser according to claim 8, wherein the third metal layer extends along the first semiconductor mesa.

15. The integrated quantum cascade laser according to claim 8, wherein the third bump electrode extends along the first semiconductor mesa.

16. The integrated quantum cascade laser according to claim 8, wherein the third metal layer, the first semiconductor mesa, the second semiconductor mesa and the fourth metal layer are arranged in order in a direction intersecting the first axis.

17. The integrated quantum cascade laser according to claim 8, wherein the third bump electrode, the first semiconductor mesa, the second semiconductor mesa, and the fourth bump electrode are arranged in order in a direction intersecting the first axis.

* * * * *